(12) United States Patent
Dimitrakopoulos et al.

(10) Patent No.: US 8,133,805 B2
(45) Date of Patent: Mar. 13, 2012

(54) METHODS FOR FORMING DENSE DIELECTRIC LAYER OVER POROUS DIELECTRICS

(75) Inventors: Christos D. Dimitrakopoulos, Somers, NY (US); Mark S. Chace, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 12/569,077

(22) Filed: Sep. 29, 2009

(65) Prior Publication Data

US 2010/0012858 A1 Jan. 21, 2010

Related U.S. Application Data

(63) Continuation of application No. 11/693,271, filed on Mar. 29, 2007, now abandoned.

(51) Int. Cl.
*H01L 21/44* (2006.01)

(52) U.S. Cl. ........... 438/597; 438/584; 257/E21.545; 257/E21.551

(58) Field of Classification Search ............. 438/584, 438/597; 257/E29.2, E21.545, E21.551
See application file for complete search history.

(56) References Cited

U.S. PATENT DOCUMENTS

| | | | |
|---|---|---|---|
| 4,918,027 A | 4/1990 | Fuse et al. | |
| 6,348,407 B1 | 2/2002 | Gupta et al. | |
| 6,586,160 B2 | 7/2003 | Ho et al. | |
| 6,641,981 B1 | 11/2003 | Kaneko et al. | |
| 6,756,303 B1* | 6/2004 | Erb et al. | 438/659 |
| 6,919,106 B2 | 7/2005 | Murakami et al. | |
| 7,358,169 B2 | 4/2008 | Zhu et al. | |
| 7,410,891 B2* | 8/2008 | Hshieh | 438/524 |
| 2002/0177300 A1 | 11/2002 | Chen et al. | |
| 2003/0054115 A1 | 3/2003 | Albano et al. | |
| 2004/0096593 A1 | 5/2004 | Lukas et al. | |
| 2004/0115956 A1 | 6/2004 | Ishida | |
| 2005/0184397 A1 | 8/2005 | Gates et al. | |
| 2006/0270206 A1 | 11/2006 | Cho et al. | |

FOREIGN PATENT DOCUMENTS

JP 2005123607 5/2005

OTHER PUBLICATIONS

Chang, U.S. Appl. No. 11/693,271, Notice of Allowance & Fees Due, FIS920060354US1, Oct. 7, 2009, 11 pages.

* cited by examiner

*Primary Examiner* — Alexander Ghyka
*Assistant Examiner* — Leonard Chang
(74) *Attorney, Agent, or Firm* — Katherine S. Brown; Hoffman Warnick LLC

(57) ABSTRACT

Methods for forming a dense dielectric layer over the surface of an opening in a porous inter-layer dielectric having an ultra-low dielectric constant are disclosed. The disclosure provides methods for exposing the sidewall surface and the bottom surface of the opening to a plurality of substantially parallel ultra-violet (UV) radiation rays to form a dense dielectric layer having a substantially uniform thickness over both the sidewall surface and the bottom surface.

18 Claims, 9 Drawing Sheets

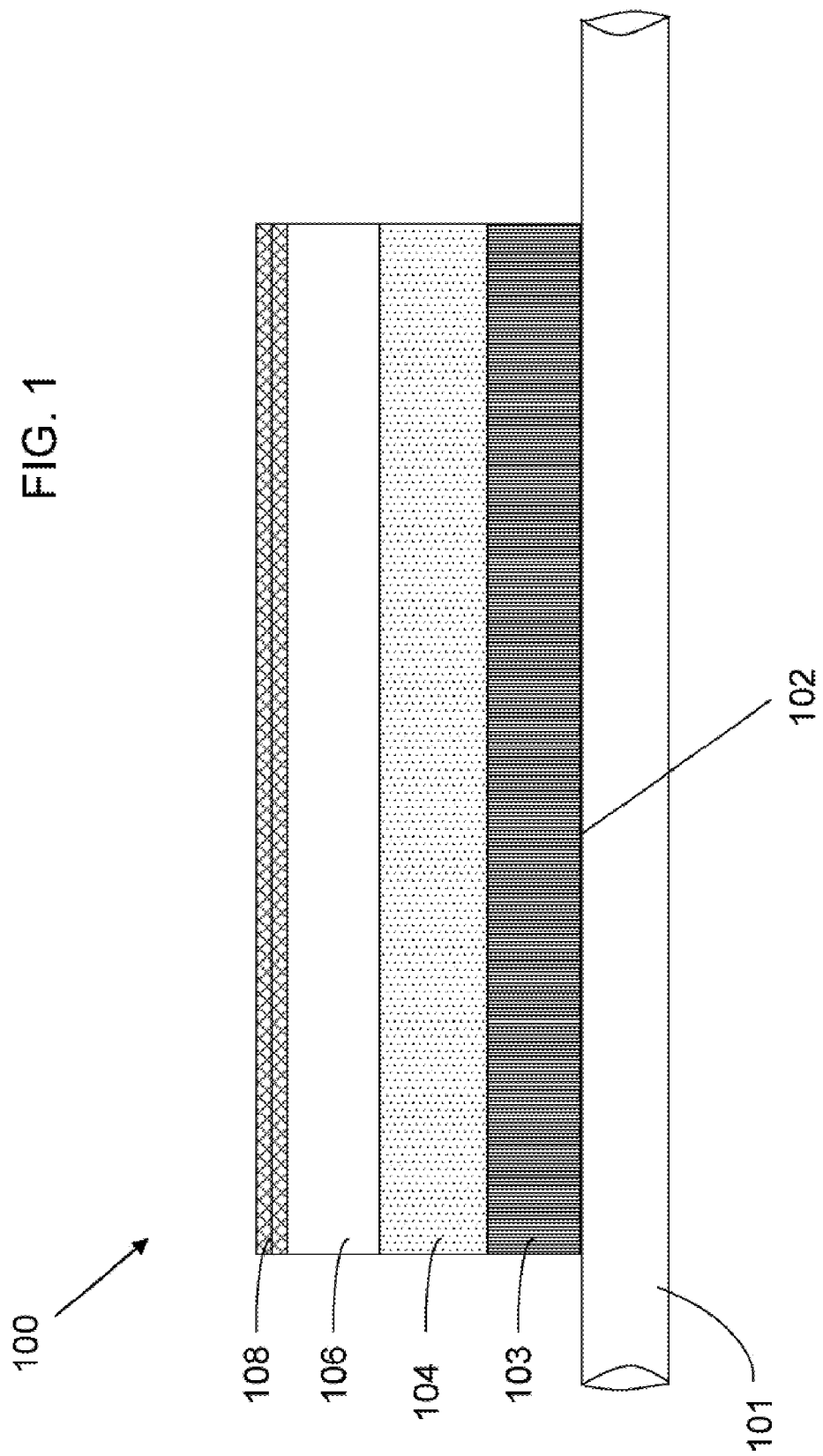

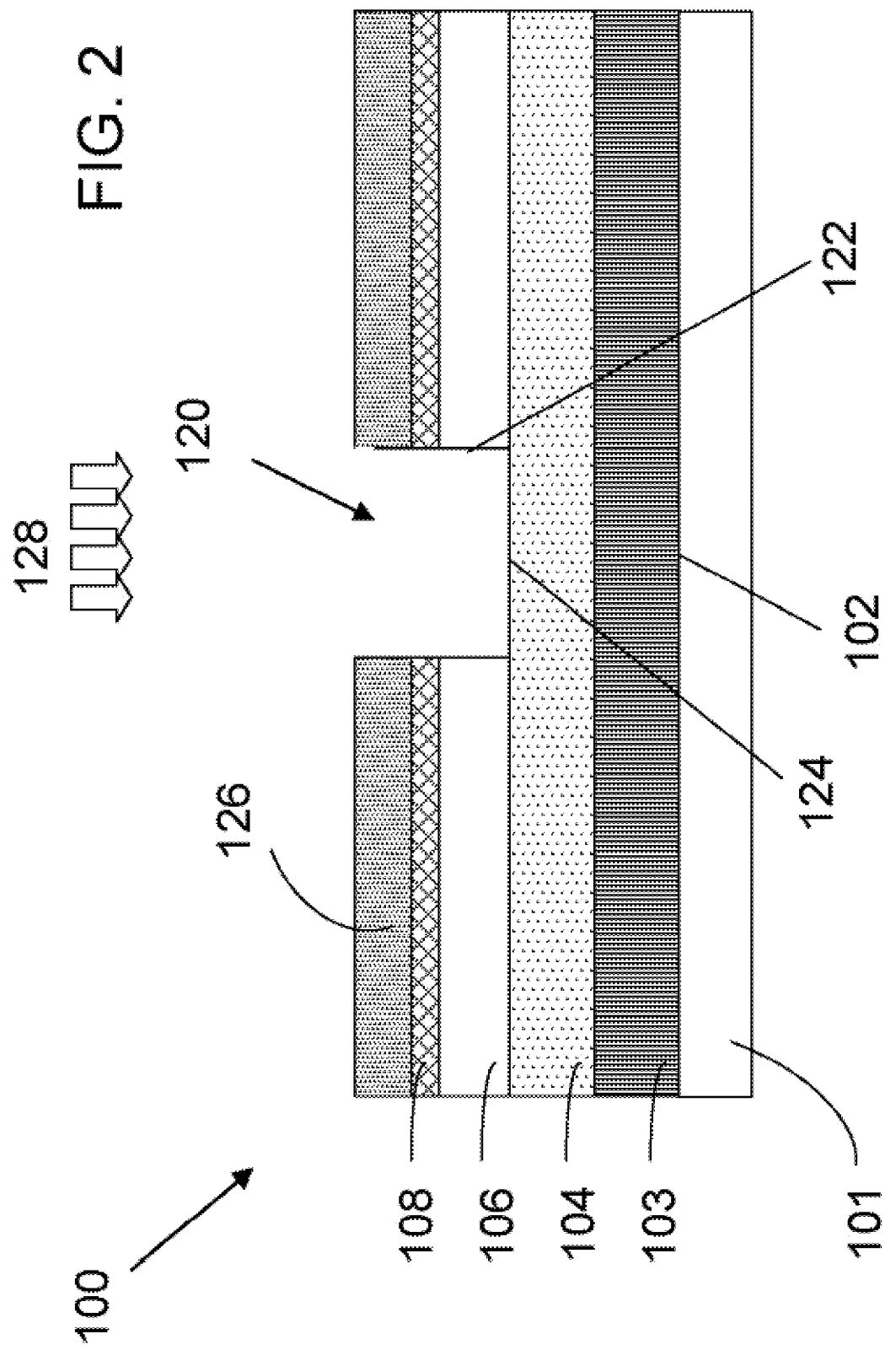

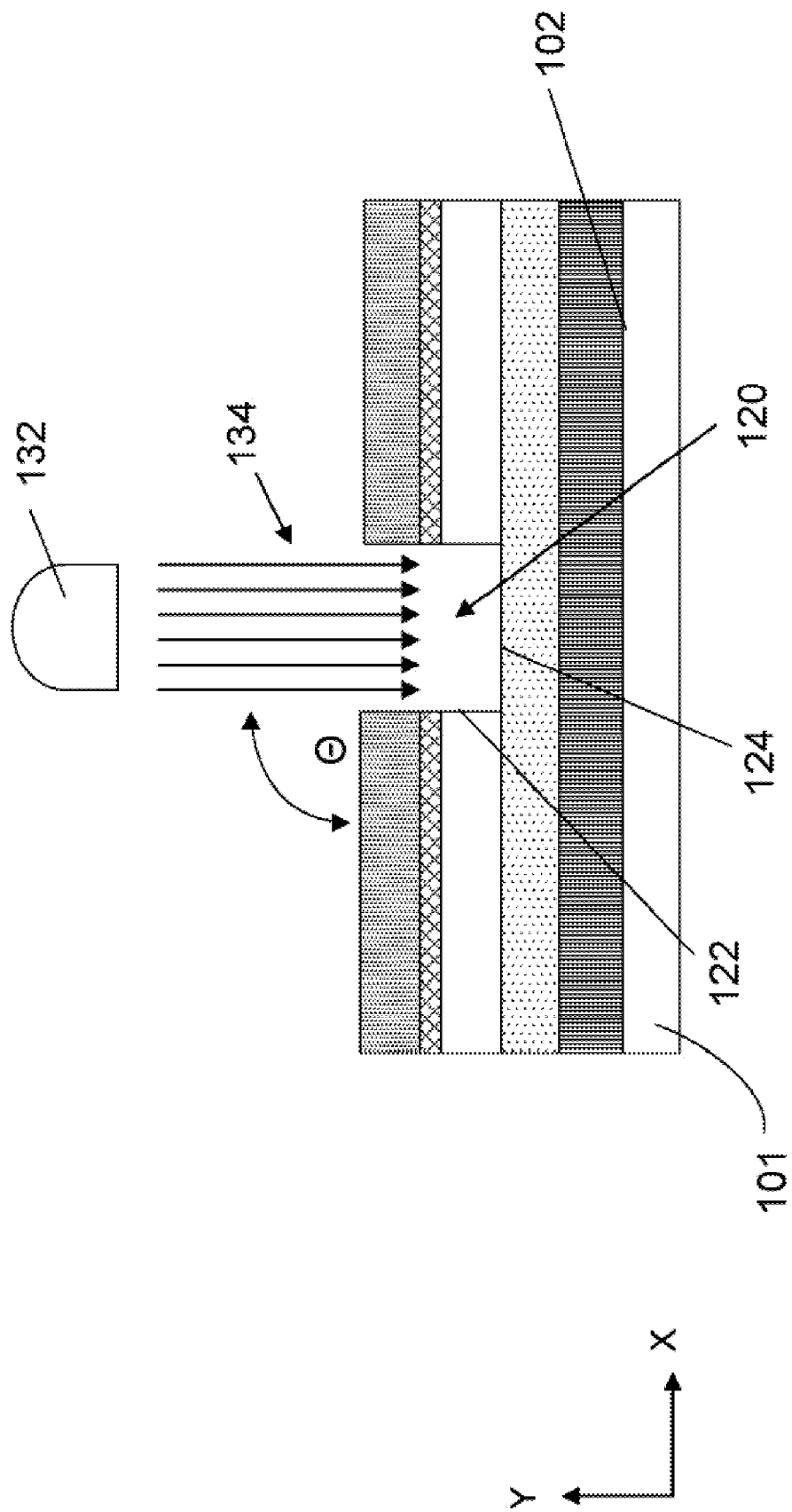

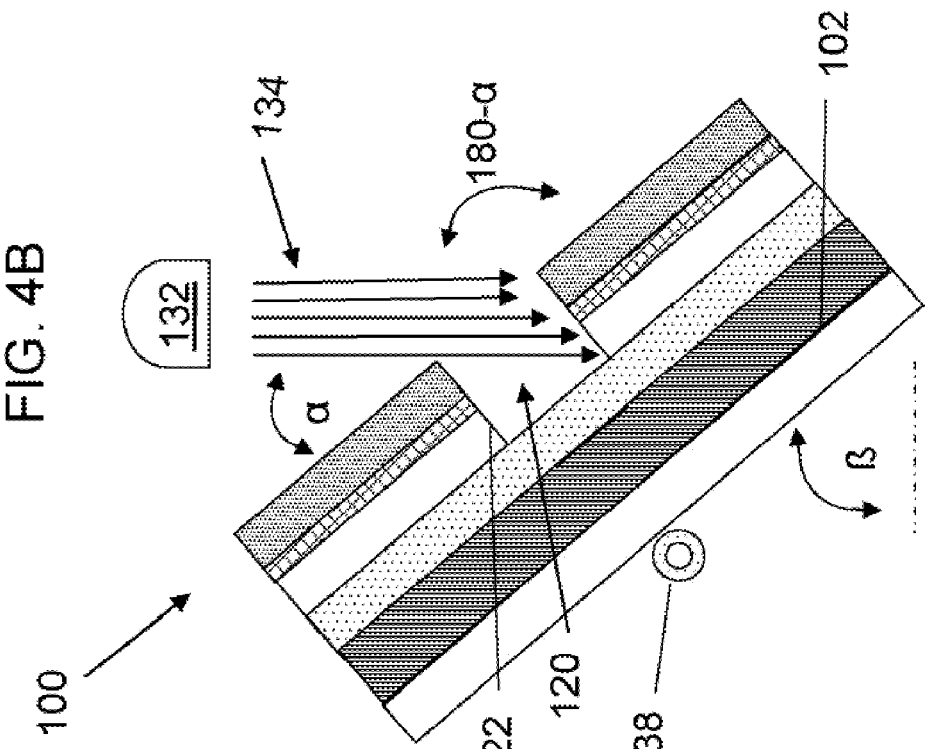
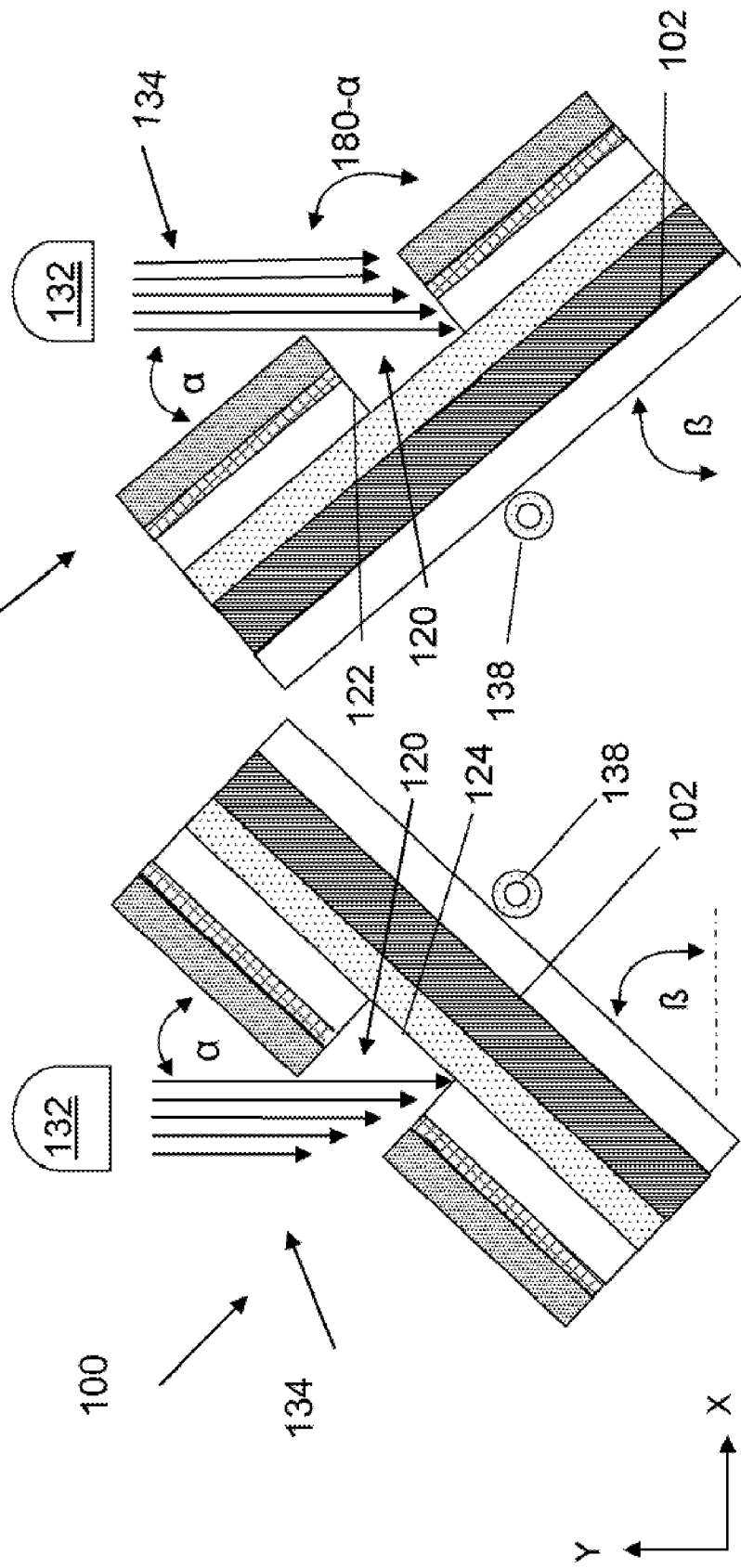

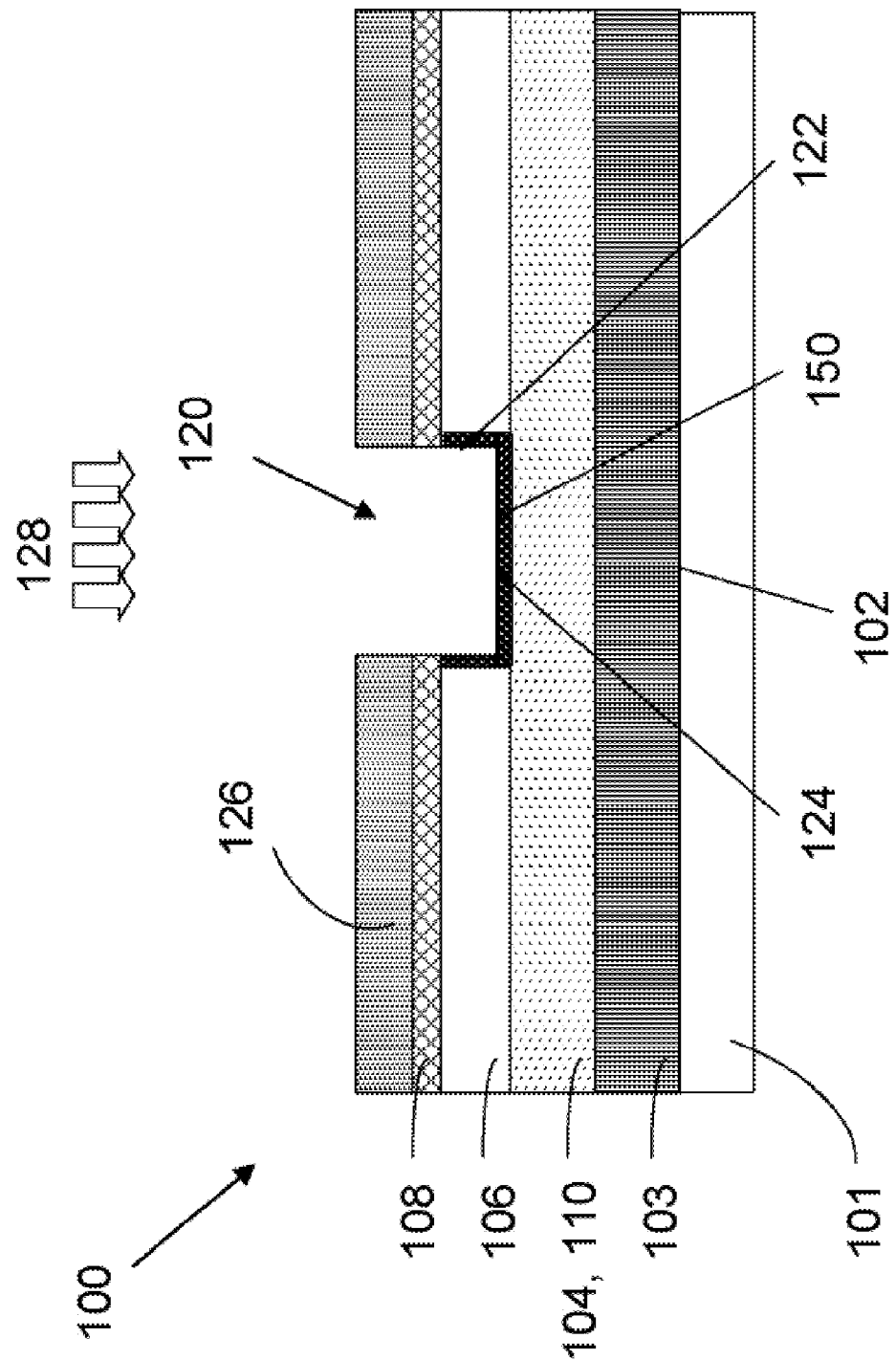

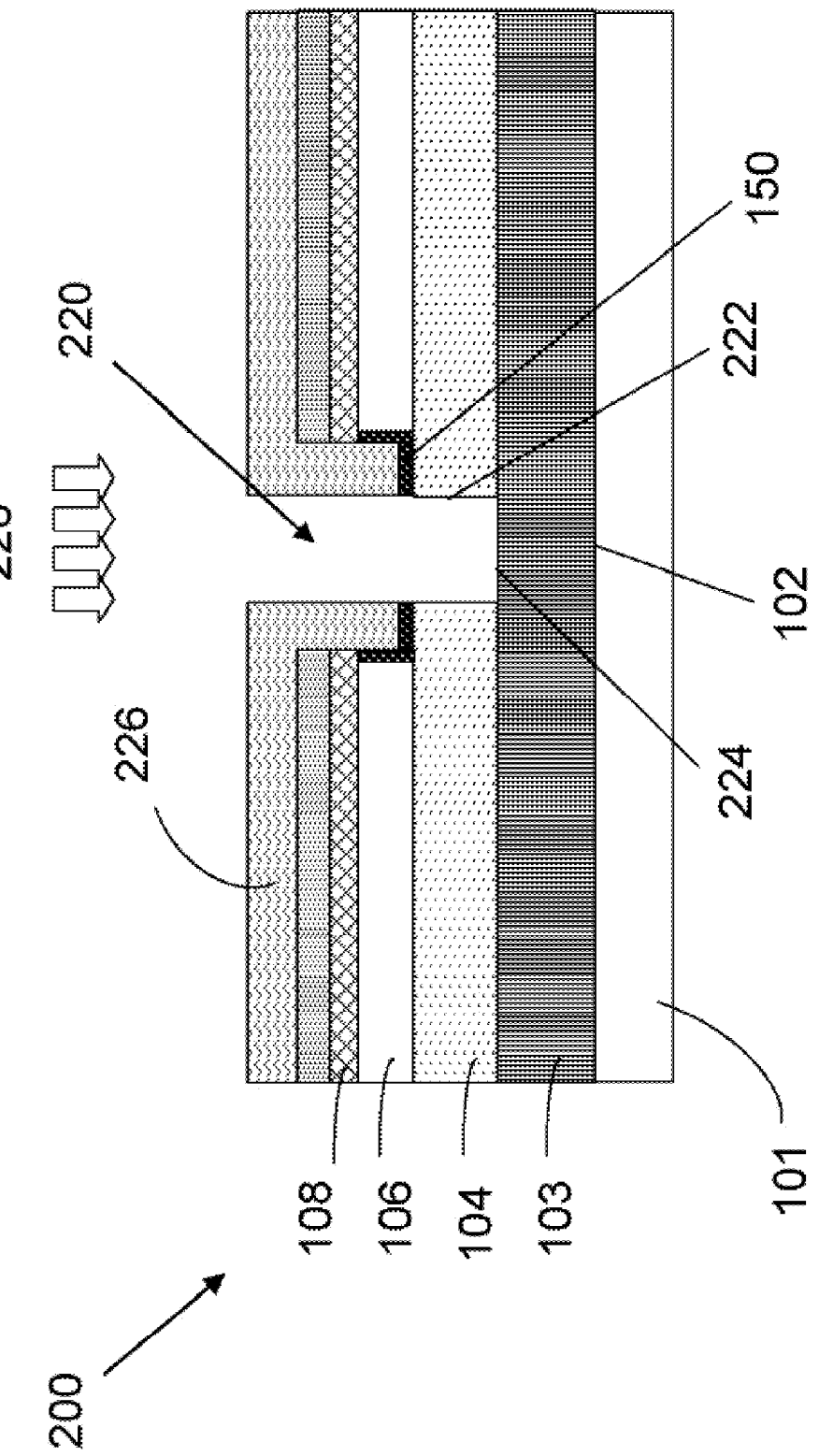

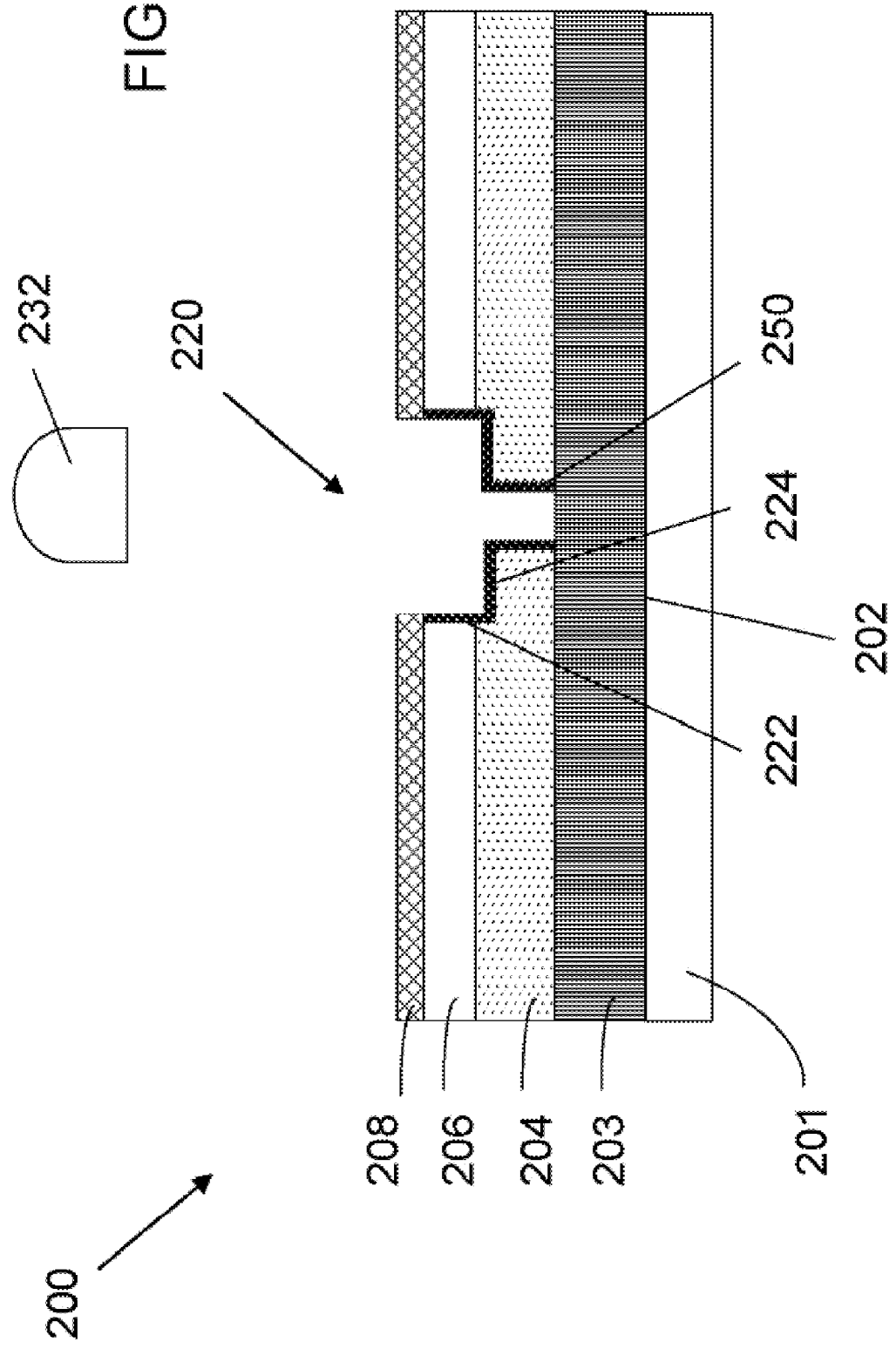

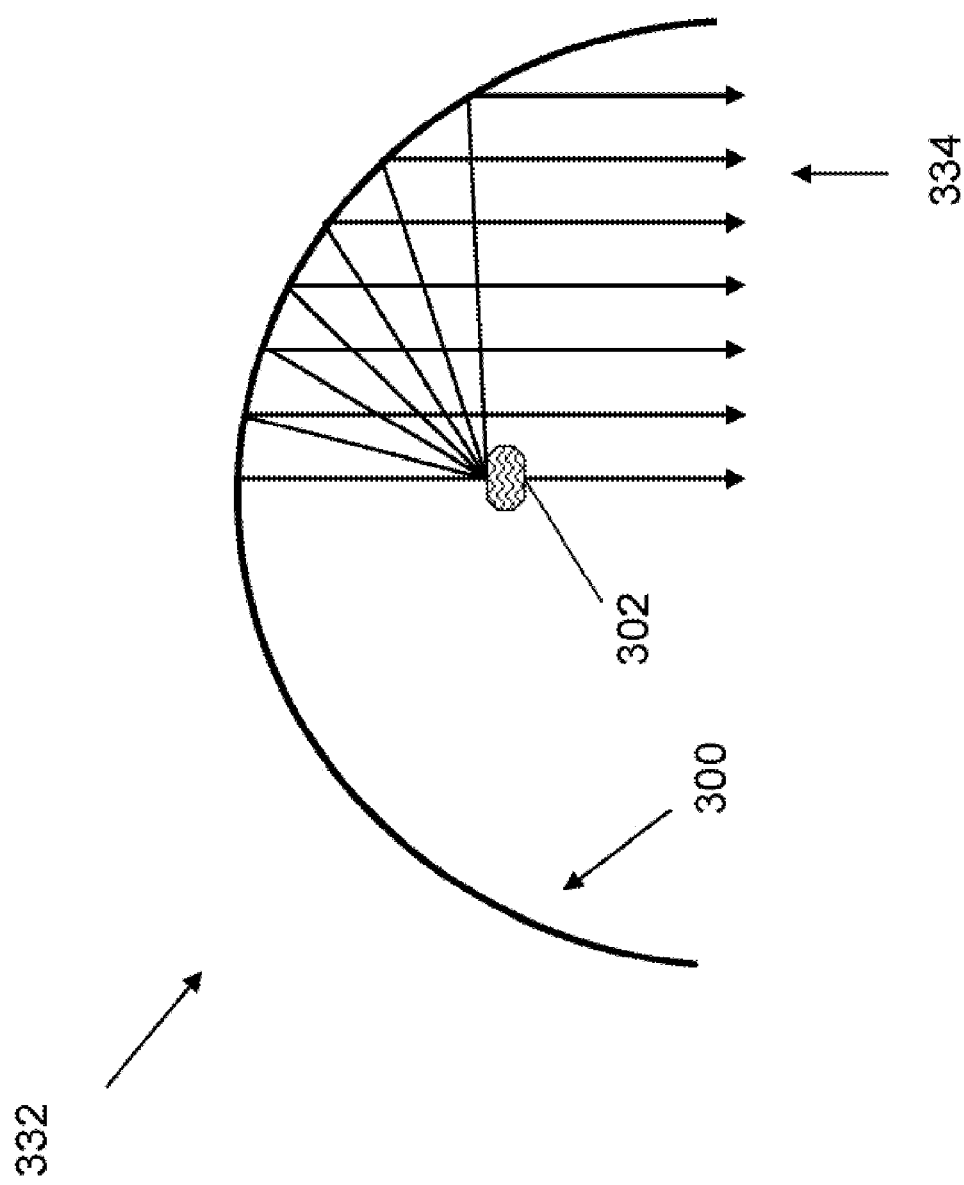

METHODS FOR FORMING DENSE DIELECTRIC LAYER OVER POROUS DIELECTRICS

The current application is a continuation application of co-pending U.S. patent application Ser. No. 11/693,271, filed on Mar. 29, 2007, which is hereby incorporated by reference.

BACKGROUND OF THE DISCLOSURE

1. Technical Field

The disclosure relates generally to semiconductor fabrication, and more particularly, to forming a dense dielectric layer over the surface of an opening in a porous inter-layer dielectric having an ultra-low dielectric constant.

2. Background Art

Recent rapid advancement in semiconductor technology has brought the advent of very large scale integrated (VLSI) as well as ultra large scale integrated (ULSI) circuits, resulting in integration of more devices into smaller areas on a single semiconductor substrate. In order to further enhance performance of the VLSI and/or ULSI circuits, ultra-low dielectric constant (ULK) materials, such as porous materials, are being used as inter-level dielectrics (i.e., via level dielectrics) and intra-level dielectrics (i.e., line level dielectrics), both referred to as ILDs, herein. ILDs, alternatively known as inter-metal dielectrics (IMDs), are used to further reduce capacitance such as, for example, inter-layer capacitance and intra-layer capacitance that adversely affect circuit performance.

An interconnect structure, which may include metal lines and vias formed in trenches and via openings, respectively, may be formed by first creating a pattern of three-dimensional interconnected openings in the ILD of a porous ULK material. As is known in the art, the structure or pattern may be formed through processes such as lithography and etching, e.g., reactive ion etching (RIE). Subsequently, a metal element or material may be deposited into the trenches and/or via openings of the formed structure pattern to create metal contact lines. Excess metal being deposited on the top surface of the ULK ILD may be removed through a chemical mechanical planarization (CMP) process. On the other hand, it is also known in the art that depositing a copper (Cu) barrier metal (liner), such as tantalum nitride (Ta/TaN), onto a surface of a porous ULK ILD using a conventional process designed or optimized for dense ILD build may cause elements of the metal to penetrate or intrude into the porous material of the ULK ILD. This penetration or intrusion of metal into porous ULK ILDs may cause performance degradation of the metal interconnects formed thereon, as well as degradation of the insulating capability of the ILD. In a worst case, this insulating degradation causes shorting between neighboring elements of the interconnect structure.

Some porous ILDs with dielectric constants in the range of 1.8 to 2.5 also have an interconnected pore structure. The interconnected porosity poses a challenge for the application of advanced liner processes (e.g., thermal and ion-induced atomic layer deposition (iALD), or plasma-enhanced chemical vapor deposition (PECVD)) due to chemical precursors penetrating into the ILD, resulting in degraded back-end-of-line (BEOL) performance, including increased leakage and reduced reliability.

A number of approaches have been employed to address this situation. In one approach, a pore-sealing layer is provided by spin-on chemistries. This approach, however, is not ideal because of the non-uniformity of coverage within and across different features (e.g., sidewall versus the bottom of the opening, different size openings, pattern density dependence, etc.), and the additional burden on the liner process to clean up the bottom of vias to ensure good electrical contact. Furthermore, penetration of the pore-sealing molecules into the ULK dielectric depends on the degree of pore interconnectivity in the ULK. In the case that the ULK ILD has no interconnected pores, the densification of the surface layer is ineffective.

SUMMARY OF THE DISCLOSURE

Methods for forming a dense dielectric layer over the surface of an opening in a porous inter-layer dielectric having an ultra-low dielectric constant are disclosed. The disclosure provides methods for exposing the sidewall surface and the bottom surface of the opening to a plurality of substantially parallel ultra-violet (UV) radiation rays to form a dense dielectric layer having a substantially uniform thickness over both the sidewall surface and the bottom surface.

A first aspect of the disclosure includes a method comprising: forming an opening in an inter-layer dielectric (ILD) on a wafer, wherein the opening has a sidewall surface and a bottom surface; and exposing the opening to a plurality of substantially parallel UV radiation rays to form a dense dielectric layer having a substantially uniform thickness over both the sidewall surface and the bottom surface.

A second aspect of the disclosure provides a method comprising: forming an opening in a inter-layer dielectric (ILD) on a wafer, the ILD having an ultra-low dielectric constant, wherein the opening has a sidewall surface and a bottom surface; and exposing the sidewall surface and the bottom surface to a plurality of substantially parallel ultra-violet (UV) radiation rays to form a dense dielectric layer having a substantially uniform thickness over both the sidewall surface and the bottom surface, and wherein the exposing comprises: exposing the bottom surface to the plurality of substantially parallel UV radiation rays at a first angle of incidence; and exposing the sidewall surface to the plurality of substantially parallel UV radiation rays at a second angle of incidence different than the first angle of incidence, the exposure to the bottom surface and the sidewall surface being substantially uniform.

A third aspect of the disclosure provides a method comprising: forming an opening in an inter-layer dielectric (ILD) on a wafer, the ILD having an ultra-low dielectric constant, and the opening having a sidewall surface and a bottom surface; and exposing the sidewall surface and the bottom surface to a plurality of substantially parallel ultra-violet (UV) radiation rays from a UV radiation source to form a dense dielectric layer having a substantially uniform thickness over both the sidewall surface and the bottom surface, and wherein the exposing comprises: exposing the bottom surface to the plurality of substantially parallel UV radiation rays at a first angle of incidence; exposing the sidewall surface to the plurality of substantially parallel UV radiation rays at a second angle of incidence different than the first angle of incidence, the exposure to the bottom surface and the sidewall surface being substantially uniform; and wherein the first angle of incidence is substantially perpendicular to a plane formed by the bottom surface, and wherein the second angle of incidence is based on the dimensions of the opening and is equal to an angle that provides exposure to the sidewall surface without exposing the bottom surface.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 1-7 show embodiments of a method according to the disclosure.

FIG. 8 shows embodiments of a semiconductor structure resulting from the methods of FIGS. 1-7.

FIG. 9 shows a UV radiation source of one embodiment of a method according to the disclosure.

Figure 5B:
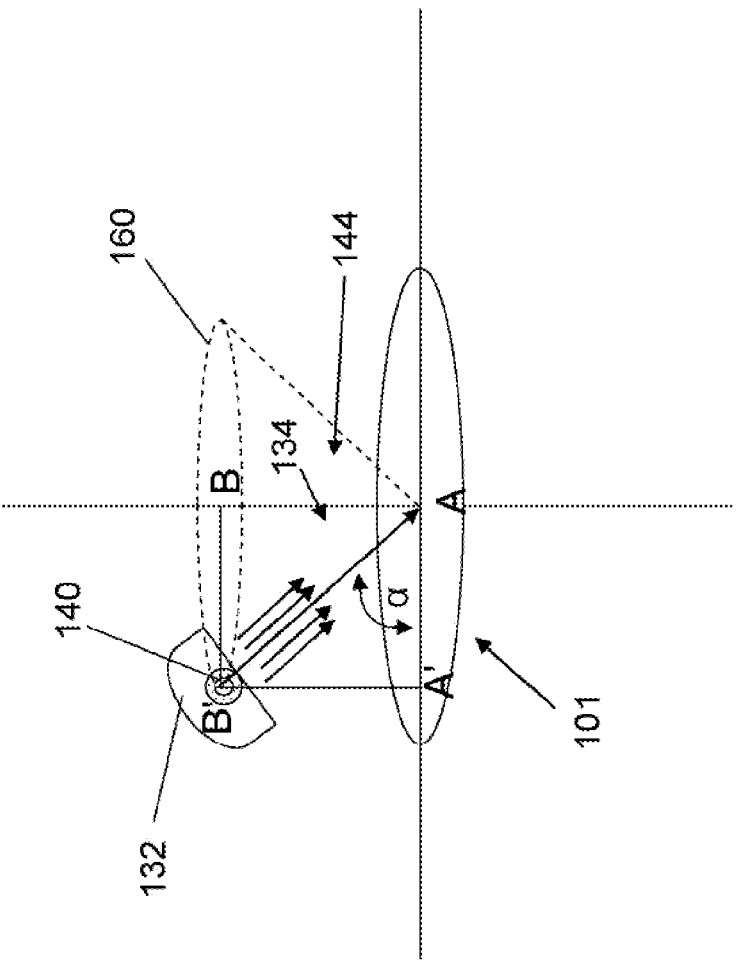

It is noted that the drawings of the disclosure are not to scale. The drawings are intended to depict only typical aspects of the disclosure, and therefore should not be considered as limiting the scope of the disclosure.

DETAILED DESCRIPTION

Turning to the drawings, FIG. 1 shows a preliminary structure 100 on a wafer 101, to which a method according to embodiments of the disclosure will be applied. Although a single structure 100 is shown for the sake of clarity, it should be appreciated that wafer 101 may include multiple structures. In this embodiment, an interconnect wiring network (not shown) is formed using a dual damascene (DD) process. In the DD process, an inter-metal dielectric (IMD or ILD), shown as two layers 104, 106, is coated on a substrate 103. Layer 104 (e.g., a via level dielectric) and layer 106 (e.g., a line level dielectric) are shown separately for clarity of the process flow description. Layers 104, 106 may be made of the same or different dielectric materials, and in the former case, applied as a single monolithic layer. A hard mask layer or a layered stack 108 is optionally employed to facilitate etch selectivity and to serve as a polish stop. Layers 104, 106 may be porous ultra low dielectric constant materials, i.e., k of about 1.8-2.4, including plasma-enhanced chemical vapor deposition (PECVD) porous hydrogenated silicon oxycarbide (pSiCOH), spin-on hydrogen silsesquioxanes (HSQ), spin-on methyl silsesquioxanes (MSQ), spin-on mixtures of HSQ and MSQ, and spin-on mixtures of HSQ, MSQ and oligocarbosilanes (OCS).

Next, as shown in FIG. 2, an opening (trench) 120 is formed in layer 106, wherein opening 120 has a sidewall surface 122 and a bottom surface 124. Opening 120 may be formed by any now known or later developed manner such as by deposition, patterning and etching of a mask 126, and then etching 128 (e.g., reactive ion etching (RIE)) into hard mask layer 108 and layer 106. In this embodiment, the process sequence shown in FIG. 2 is referred to as a DD "line-first" approach, as opening 120 is formed prior to a via level opening. However, it should be appreciated that the present invention is not limited to the DD process described herein.

FIGS. 3-6 show a process for exposing opening 120, including bottom surface 124 (FIG. 3) and sidewall surface 122 (FIGS. 4A, 4B, 5A and 5B), to a plurality of substantially parallel UV radiation rays 134 to form a dense dielectric layer 150 (FIG. 6 only) having a substantially uniform thickness over both sidewall surface(s) 122 and bottom surface(s) 124. Dense dielectric layer 150 (FIG. 6 only) may be formed using an ultra-violet (UV) radiation source 132 for producing plurality of substantially parallel UV radiation rays 134. The exposure to sidewall surface 122 and bottom surface 124 may occur in one of: a non-oxidizing atmosphere, a reducing atmosphere, and a vacuum. In one embodiment, as shown in FIG. 3, UV radiation source 132 exposes bottom surface(s) 124 to plurality of substantially parallel UV radiation rays 134 at a first angle of incidence (Θ) relative to a wafer plane formed by top surface 102 of wafer 101, wherein the first angle of incidence is approximately 90°.

In a next process, as shown in FIGS. 4A-4B, UV radiation source 132 exposes sidewall surface(s) 122 to the plurality of substantially parallel UV radiation rays 134 at a second angle of incidence (α) relative to the wafer plane, wherein the second angle of incidence is different than the first angle of incidence (Θ) (FIG. 3). As shown in FIGS. 4A-4B, the second angle of incidence is based on the dimensions of the opening and is equal to an angle that provides exposure to sidewall surface(s) 122 without exposing bottom surface 124. Therefore, by selecting an appropriate angle to expose sidewall surface(s) 122 based on the dimensions of opening 120, exposure to bottom surface 124 and sidewall surface 122 will be substantially uniform.

As shown by FIGS. 4A-4B, structure 100 is orientated at an angle (β) relative to the horizontal X-axis, wherein angle β is related to the second angle of incidence (α) by the equation β=90°−α. As shown, structure 100 may be attached to a wafer 101 or other operative structural support that provides the desired angle β (provided by pivot member 138) relative to the horizontal X-axis. In one embodiment, sidewall surface(s) 122 is exposed by incrementally rotating structure 100 about an axis that passes through the center of the wafer 101 and is substantially perpendicular to a wafer plane formed by top surface 102 of wafer 101, and simultaneously pivoting wafer 101 about an axis that passes through the center of wafer 101 and is substantially parallel to the wafer plane, wherein wafer 101 is pivoted by an angle relative to the plurality of substantially parallel UV radiation rays 134 equal to approximately the second angle of incidence (α). In this embodiment, UV radiation source 132 is stationary as wafer 101 is moving. Each incremental rotation is followed by a UV exposure period of approximately 15-180 seconds, depending on the intensity of plurality of substantially parallel UV radiation rays 134 from UV radiation source 132, at a pivot angle equal to approximately the second angle of incidence (α) (FIGS. 4A-4B). Wafer 101 is successively rotated and exposed at the pivot angle (α) until the sum of the incremental rotation angles is 360°. In another embodiment, each incremental rotation corresponds to a UV exposure period at a first pivot angle equal to approximately the second angle of incidence (α) (FIG. 4A) and a subsequent UV exposure period at a second pivot angle equal to approximately 180 −α (FIG. 4B). In this case, wafer 101 is rotated continuously until the sum of the incremental rotation angles is 180°.

In another embodiment, as shown in FIGS. 4A-4B, sidewall surface(s) 122 is exposed by rotating wafer 101 about an axis that passes through the center of wafer 101 and is substantially perpendicular to the wafer plane, wherein wafer 101 is maintained at a fixed angle relative to plurality of substantially parallel UV radiation rays 134 equal to approximately the second angle of incidence (α). In this embodiment, UV radiation source 132 is stationary as structure 100 is moving. Wafer 101 is maintained at an angle (β) (provided by pivot member 138) relative to the horizontal X-axis to provide uniform exposure of sidewall surface(s) 122 as wafer 101 is continuously rotated. Additionally, wafer 101 may be simultaneously rotated about an axis that passes from the center of the wafer 101 and is substantially parallel to plurality of substantially parallel UV radiation rays 134. This simultaneous rotation ensures uniform exposure to sidewall(s) 122 in the case that UV radiation source 132 fails to provide uniform exposure to wafer 101.

Figure 5A:
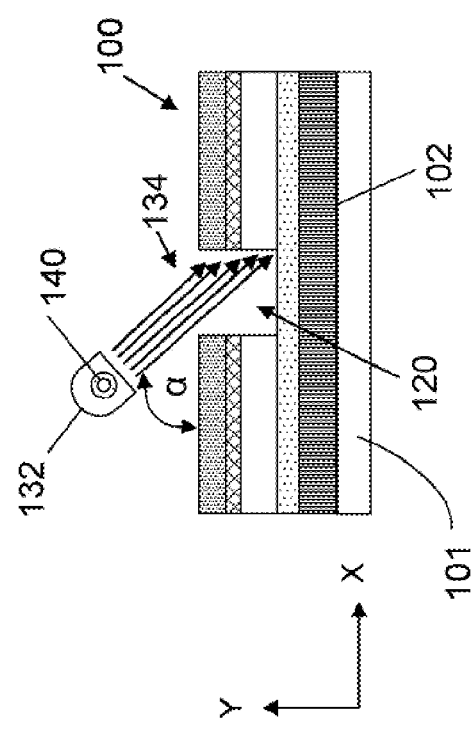

In yet another embodiment, as shown in FIGS. 5A-5B, UV radiation source 132 is moving while structure 100 is stationary. In this arrangement, UV source 132 is moving relative to the center of wafer 101 in such a way that the geometrical positions of wafer 101 and UV radiation source 132 relative to one another, as shown in FIGS. 3-4A-B, are simulated. In this case, sidewall surface(s) 122 is exposed by positioning UV radiation source 132 relative to wafer 101 so that plurality of substantially parallel UV radiation rays 134 form an angle of incidence ($\alpha$) with the wafer plane equal to approximately the second angle of incidence. UV radiation source 132 is positioned relative to wafer 101 so that the center of radiation area 144 formed by UV radiation source 132 corresponds to the center of wafer 101. UV radiation source 132 is then incrementally rotated about an axis (AB of FIG. 5B) that passes through the center of wafer 101 and is substantially perpendicular to the wafer plane.

In this embodiment, as shown in FIG. 5B, the distance between the center of UV radiation source 132 and the wafer plane is represented by A'B', and the angle of plurality of substantially parallel UV radiation rays 134 relative to the wafer plane is equal to approximately the second angle of incidence ($\alpha$). UV radiation source 132 is positioned at a distance BB' from the axis that passes through the center of wafer 101 and is perpendicular to the wafer plane, distance BB' being represented by the equation $$BB' = \frac{A'B'}{\tan\alpha}.$$

UV radiation source 132 is simultaneously rotated around an axis that passes through the center of radiation source 132 and is perpendicular to the plane formed by A'B' and BB', in such a way that plurality of parallel UV radiation rays 134 emitted from UV radiation source 132 are oriented at an angle relative to the wafer plane equal to approximately the second angle of incidence ($\alpha$). Following a UV exposure period at this initial position, UV radiation source 132 is incrementally rotated about an axis that passes through the center of wafer 101 and is substantially perpendicular to the wafer plane (the axis being defined by points A and B), until the sum of the incremental rotation angles is approximately 360°. As shown in FIG. 5B, the locus of motion of the UV radiation source 132 is a circle 160 having a radius equal to BB', circle 160 forming a plane that is substantially parallel to the wafer plane. The center of circle 160 is located on the axis that passes through the center of wafer 101 and is substantially perpendicular to the wafer plane, wherein the center of circle 160 is located at a distance AB from wafer 101.

As a result of the above-described methods, uniform exposure to sidewall surface(s) 122 is provided. As shown in FIG. 6, this exposure results in uniform demethylation and densification of exposed sidewall surface(s) 122 and bottom surface(s) 124, producing a carbon depleted, dense (i.e., having a density greater than approximately 1.3 gram/cm$^3$), silicon-dioxide (SiO$_2$)-like layer 150. Dense dielectric layer 150 prevents the diffusion of environmental and process chemicals into the underlying porous ILD 104, 106. This facilitates the formation of continuous, substantially defect free metal diffusion barriers.

Although not shown, formation of dense dielectric layer 150 may be subsequently followed by conventional processing steps including, for example, coating the opening with a conducting liner material that serves to protect the conductor metal lines. The opening may be filled with a conducting fill material over the surface of the structure and opening. The fill is most commonly accomplished by electroplating of copper, although other methods such as chemical vapor deposition (CVD) and other materials such as aluminum or gold can also be used. The fill and liner materials are then chemical-mechanical polished (CMP) to be coplanar with the surface of the hard mask and the structure. A capping material may then be deposited as a blanket film on top. This process sequence may be repeated for each level of the interconnects on the device.

Alternatively, as shown in FIG. 7, the processing shown in FIG. 2 may be repeated to form an opening (via) 220 in layer 104, wherein opening 220 has a sidewall surface(s) 222 and a bottom surface(s) 224. Opening 220 may be formed by any now known or later developed manner such as by deposition, patterning and etching of a mask 226, and then etching 228 (e.g., reactive ion etching (RIE)) into layer 104. In one embodiment, the processing shown in FIGS. 4-5 is repeated to expose the sidewall surface(s) 222 to plurality of substantially parallel UV radiation rays 134 (FIGS. 4-5 only) to form a dense dielectric layer 250 (FIG. 8 only) having a substantially uniform thickness over the sidewall surface(s) 222. In this embodiment, as shown in FIG. 7, opening 220 may be a via, and the second angle of incidence is no greater than approximately 45°. In one embodiment, bottom surface 224 of via 220 includes an underlying metal structure (not shown) and exposure to the bottom surface is unnecessary. In yet another embodiment, layer 104 is a dense dielectric material, e.g., SiCOH with k=about 2.5-3.0, or silicon dioxide (SiO$_2$), and exposure to sidewall surface(s) 222 and bottom surface 224 is unnecessary.

FIG. 8 shows a structure 200 formed using the above-described methods. Structure 200 includes a dielectric stack 104, 106 with an opening 220 in a porous inter-layer dielectric (ILD) 104, 106 having an ultra-low dielectric constant, the opening including sidewall surface(s) 222 and bottom surface(s) 224. An ultra-violet (UV) radiation source 232 is also shown for exposing sidewall surface(s) 222 and bottom surface(s) 224 to a plurality of substantially parallel UV radiation rays (not shown) to form a dense dielectric layer 250 having a substantially uniform thickness over both sidewall surface(s) 222 and bottom surface(s) 224. Dense dielectric layer 250 should be ultra-thin (i.e., between 1 nm and 10 nm) to prevent a significant increase of the dielectric constant (k) for structure 200. Furthermore, dense dielectric layer 250 has a density greater than approximately 1.3 gram/cm$^3$.

Although not shown, formation of dense dielectric layer 250 may be subsequently followed by conventional processing steps including, for example, coating the opening with a conducting liner material that serves to protect the vias. The opening may be filled with a conducting fill material over the surface of the structure and opening. The fill is most commonly accomplished by electroplating of copper, although other methods such as chemical vapor deposition (CVD) and other materials such as aluminum or gold can also be used. The fill and liner materials are then chemical-mechanical polished (CMP) to be coplanar with the surface of the hard mask and the structure. A capping material may then be deposited as a blanket film on top. This process sequence may be repeated for each level of the interconnects on the device.

FIG. 9 shows radiation source 332 for producing plurality of UV radiation rays 334. In this embodiment, the plurality of substantially parallel UV radiation rays 334 are produced by a reflector 300 and a UV light source 302 configured to reflect a plurality of UV radiation rays 334 over the wafer from UV light source 302 in a substantially parallel direction. For example, reflector 300, with a parabolic cross-section, may be used with a spherical UV light source 302 placed in the focus of the paraboloid. In another embodiment (not shown), UV light source 302 is cylindrical, and reflector 300 has the shape of a parabolic trough, with the cylindrical UV light source 302 placed with its long axis substantially perpendicular to the parabola plane and passing through the focus of the parabola. However, the reflector/light source configuration may include any now known or later developed techniques appropriate for producing a plurality of substantially parallel UV radiation rays and are not limited to the examples presented herein. Furthermore, in one embodiment, UV radiation has a wavelength between 130 and 193 nm, with a preferred wavelength of 172 nm. The UV radiation is absorbed by the dielectric materials and limited to an exposure depth of between 1-10 nm from the surface.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:
   forming an opening in an inter-layer dielectric (ILD) on a wafer, wherein the opening includes a sidewall surface and a bottom surface; and
   exposing the opening to a plurality of substantially parallel ultra-violet (UV) radiation rays to form a dense dielectric layer having a substantially uniform thickness over both the sidewall surface and the bottom surface, wherein the exposing comprises:
      exposing the bottom surface to the plurality of substantially parallel UV radiation rays at a first angle of incidence; and
      exposing the sidewall surface to the plurality of substantially parallel UV radiation rays at a second angle of incidence different than the first angle of incidence,
      wherein the second angle of incidence is based on dimensions of the opening and is equal to an angle that provides exposure to the sidewall surface without exposing the bottom surface, such that the exposure to the bottom surface and the sidewall surface is substantially uniform, and wherein exposing the sidewall surface includes positioning the wafer at an angle relative to the plurality of substantially parallel UV radiation rays equal to approximately the second angle of incidence.

2. The method claim 1, wherein the exposing the sidewall surface includes one of:
   (a) incrementally rotating the wafer about an axis that passes through the center of the wafer and is substantially perpendicular to a wafer plane formed by the top surface of the wafer, and simultaneously pivoting the wafer about an axis that passes through the center of the wafer and is substantially parallel to the wafer plane, wherein the wafer is pivoted by the angle relative to the plurality of substantially parallel UV radiation rays equal to approximately the second angle of incidence; and
   (b) rotating the wafer about an axis that passes through the center of the wafer and is substantially perpendicular to the wafer plane, wherein the wafer is maintained at the angle relative to the plurality of substantially parallel UV radiation rays equal to approximately the second angle of incidence.

3. The method of claim 2, wherein the rotating of the wafer about an axis that passes through the center of the wafer and is substantially perpendicular to the wafer plane further comprises simultaneously rotating the wafer about an axis that passes from the center of the wafer and is substantially parallel to the plurality of substantially parallel UV radiation rays.

4. The method of claim 2, wherein the first angle of incidence is substantially perpendicular to a plane formed by the wafer.

5. The method of claim 2, wherein the UV radiation source includes a reflector and a UV light source configured to reflect a plurality of UV radiation rays over the wafer from the UV light source in a substantially parallel direction.

6. The method of claim 1, wherein the exposure to the sidewall surface and the bottom surface occurs in one of: a non-oxidizing atmosphere, a reducing atmosphere, and a vacuum.

7. The method of claim 1, wherein the second angle of incidence is no greater than about 45°.

8. The method of claim 1, wherein the ILD includes a porous material having an ultralow dielectric constant.

9. The method of claim 1, wherein the opening includes at least one of: a via opening and a trench.

10. The method of claim 1, wherein the ILD includes a material selected from the group consisting of: plasma-enhanced chemical vapor deposition (PECVD) porous hydrogenated silicon oxycarbide (pSiCOH), spin-on hydrogen silsesquioxanes (HSQ), spin-on methyl silsesquioxanes (MSQ), spin-on mixtures of HSQ and MSQ, and spin-on mixtures of HSQ, MSQ and oligocarbosilanes (OCS).

11. The method of claim 1, wherein the plurality of UV radiation rays have a wavelength between approximately 130 nm and approximately 193 nm.

12. A method comprising:
   forming an opening in a porous inter-layer dielectric (ILD) on a wafer, the ILD having an ultra-low dielectric constant, wherein the opening includes a sidewall surface and a bottom surface; and
   exposing the sidewall surface and the bottom surface to a plurality of substantially parallel ultra-violet (UV) radiation rays to form a dense dielectric layer having a substantially uniform thickness over both the sidewall surface and the bottom surface, and
   wherein the exposing comprises:
      exposing the bottom surface to the plurality of substantially parallel UV radiation rays at a first angle of incidence; and
      exposing the sidewall surface to the plurality of substantially parallel UV radiation rays at a second angle of incidence different than the first angle of incidence, the exposure to the bottom surface and the sidewall surface being substantially uniform, wherein exposing the sidewall surface further includes:
         positioning a UV radiation source relative to the wafer so that the plurality of substantially parallel UV radiation rays form an angle of incidence ($\alpha$) with the wafer plane equal to approximately the second angle of incidence, and (ii) positioning the UV radiation source relative to the wafer so that a center of a radiation area formed by the UV radiation source corresponds to the center of the wafer, and (iii) incrementally rotating the UV radiation source about an axis that passes through the center of the wafer and is substantially perpendicular to the wafer plane.

13. The method of claim 12, wherein the first angle of incidence is substantially perpendicular to a plane formed by the wafer, and wherein the second angle of incidence is based on the dimensions of the opening and is approximately equal to an angle that provides exposure to the sidewall surface without exposing the bottom surface.

14. The method of claim 12, wherein the opening includes at least one of: a via opening and a trench.

15. The method of claim 12, wherein the UV radiation source includes a UV light source configured to reflect a plurality of UV radiation rays from the UV light source in a substantially parallel direction.

16. A method comprising:
   forming an opening in a porous inter-layer dielectric (ILD) on a wafer, the ILD having an ultra-low dielectric constant, and the opening having a sidewall surface and a bottom surface; and
   exposing the sidewall surface and the bottom surface to a plurality of substantially parallel ultra-violet (UV) radiation rays from a UV radiation source to form a dense dielectric layer having a substantially uniform thickness over both the sidewall surface and the bottom surface, and
   wherein the exposing comprises:
      exposing the bottom surface to the plurality of substantially parallel UV radiation rays at a first angle of incidence;
      exposing the sidewall surface to the plurality of substantially parallel UV radiation rays at a second angle of incidence different than the first angle of incidence, the exposure to the bottom surface and the sidewall surface being substantially uniform; and
      wherein the first angle of incidence is substantially perpendicular to a plane formed by the bottom surface, and wherein the second angle of incidence is based on the dimensions of the opening and is approximately equal to an angle that provides exposure to the sidewall surface without exposing the bottom surface, and wherein exposing the sidewall surface includes positioning the wafer at an angle relative to the plurality of substantially parallel UV radiation rays equal to approximately the second angle of incidence.

17. The method of claim 16, wherein the exposing the sidewall surface includes one of:
   (a) incrementally rotating the wafer about an axis that passes through the center of the wafer and is substantially perpendicular to a wafer plane formed by the top surface of the wafer, and simultaneously pivoting the wafer about an axis that passes through the center of the wafer and is substantially parallel to the wafer plane, wherein the wafer is pivoted by the angle relative to the plurality of substantially parallel UV radiation rays equal to approximately the second angle of incidence; and
   (b) rotating the wafer about an axis that passes through the center of the wafer and is substantially perpendicular to the wafer plane and simultaneously rotating the wafer about an axis that passes from the center of the wafer and is substantially parallel to the plurality of substantially parallel UV radiation rays, wherein the wafer is maintained at the angle relative to the plurality of substantially parallel UV radiation rays equal to approximately the second angle of incidence.

18. The method of claim 16, wherein the UV radiation source includes a reflector and a UV light source configured to reflect a plurality of UV radiation rays over the wafer from the UV light source in a substantially parallel direction.

* * * * *